US008441270B2

(12) United States Patent
Lee et al.

(10) Patent No.: US 8,441,270 B2

(45) Date of Patent: May 14, 2013

(54) AC DETECTION CIRCUIT FOR POWER SUPPLY

(75) Inventors: Sung Uk Lee, Gyunggi-do (KR); Dong Kyun Ryu, Seoul (KR); Nam Su Koo, Gyunggi-do (KR); Kyung Hyun Kim, Seoul (KR); Seung Heun Yang, Gyunggi-do (KR); Tai Sung Kim, Seoul (KR); Jae Han Yoon, Gyunggi-do (KR); Peel Sik Jeon, Gyunggi-do (KR); Yun Seop Shin, Gyunggi-do (KR); Kyung Su Han, Gyunggi-do (KR)

(73) Assignee: Samsung Electro-Mechanics Co., Ltd. (KP)

( * ) Notice: Subject to any disclaimer, the term of this patent is extended or adjusted under 35 U.S.C. 154(b) by 706 days.

(21) Appl. No.: 12/649,418

(22) Filed: Dec. 30, 2009

(65) Prior Publication Data

US 2011/0013435 A1 Jan. 20, 2011

(30) Foreign Application Priority Data

Jul. 15, 2009 (KR) ........................ 10-2009-0064343

(51) Int. Cl.
*G01R 27/08* (2006.01)
*H02M 3/24* (2006.01)

(52) U.S. Cl.
USPC .............................................. 324/713; 363/76

(58) Field of Classification Search ........................ None
See application file for complete search history.

(56) References Cited

U.S. PATENT DOCUMENTS

| | | | | |
|---|---|---|---|---|
| 3,286,188 | A * | 11/1966 | Castellano, Jr. | 329/325 |
| 6,885,016 | B2 * | 4/2005 | Worley et al. | 250/551 |
| 7,538,631 | B2 * | 5/2009 | Immonen et al. | 332/149 |
| 7,940,090 | B2 * | 5/2011 | Yoshida | 327/79 |
| 2004/0032754 | A1 * | 2/2004 | Yang | 363/56.09 |
| 2008/0074909 | A1 * | 3/2008 | Mehta | 363/52 |

FOREIGN PATENT DOCUMENTS

| | | |
|---|---|---|
| JP | 06054525 A | 2/1994 |

* cited by examiner

*Primary Examiner* — Jeff Natalini

(74) *Attorney, Agent, or Firm* — Lowe Hauptman Ham & Berner, LLP

(57) ABSTRACT

There is provided an alternating current (AC) detection circuit for power supply, the AC circuit including: a rectifying part rectifying an AC voltage; a voltage division part dividing the voltage rectified by the rectifying part according to a preset division ratio; a voltage stabilization circuit part stabilizing the voltage divided by the voltage division part; and a first square wave generating part comparing the voltage stabilized by the voltage stabilization circuit part with an internal reference voltage, and generating a first square wave signal having a duty ratio according to comparison results between the stabilized voltage and the internal reference.

7 Claims, 3 Drawing Sheets

AC DETECTION CIRCUIT FOR POWER SUPPLY

CROSS-REFERENCE TO RELATED APPLICATIONS

This application claims the priority of Korean Patent Application No. 10-2009-0064343 filed on Jul. 15, 2009, in the Korean Intellectual Property Office, the disclosure of which is incorporated herein by reference.

BACKGROUND OF THE INVENTION

1. Field of the Invention

The present invention relates to an alternating current (AC) detection circuit applicable to a power supply such as that of a plasma display panel (PDP), and more particularly, to an AC detection circuit for a power supply, which is configured to detect an AC input and output a square wave signal using a square wave generating part such as a shunt regulator.

2. Description of the Related Art

In general, a switching mode power supply (SMPS) applicable to a plasma display panel (PDP) TV set employs a sequence circuit so as to protect a PDP driving board. In order to employ such a sequence circuit, an alternating current (AC) detection circuit detecting AC input is required, as well as a brownout circuit blocking the sequence circuit when a low voltage is inputted.

An AC detection signal outputted from an AC detection circuit is commonly created in a direct current (DC) waveform and a square waveform, according to an AC signal's forms.

In an AC detection circuit employing the DC waveform, a sequence circuit is controlled and a brownout circuit is configured by using a Zener diode and a transistor.

Like this, a configuration using the Zener diode and the transistor uses an excessive resistance value in an input port so as to reduce the influence of standby power consumption and embody the operational characteristics of the sequence circuit and the brownout circuit, thereby causing circuit design review (CDR) problems in the case of the Zener diode and the transistor. Also, there are many components required, so the problem of cost is encountered.

The following descriptions are of circuits detecting an AC voltage using a Zener diode according to the related art. An AC detection circuit employing a DC waveform is configured to be active high by using a transistor, a Zener diode, and a photodiode. Such a circuit uses approximately twenty-seven components.

This circuit is configured to perform the conversion of an AC voltage to a DC voltage using a first Zener diode and a capacitor such as a ceramic capacitor or a film capacitor, allow a current to flow through a second Zener diode when the converted voltage is higher than a breakdown voltage in the second Zener diode, cause the current to operate a transistor, and generate an AC detection signal accordingly.

Since such an AC detection circuit according to the related art uses the Zener diode and the transistor, a complex circuit configuration is required for a bias and the protection of the Zener diode from surges. This causes an increase in the number of components, resulting in an increase in the area required for the increased components and a production cost.

SUMMARY OF THE INVENTION

An aspect of the present invention provides an alternating current (AC) detection circuit for power supply, which is configured to detect an AC and output a square wave signal using a square wave generating part such as a shunt regulator, thereby greatly reducing the number of required components.

According to an aspect of the present invention, there is provided an AC detection circuit for power supply, the AC detection circuit including: a rectifying part rectifying an AC voltage; a voltage division part dividing the voltage rectified by the rectifying part according to a preset division ratio; a voltage stabilization circuit part stabilizing the voltage divided by the voltage division part; and a first square wave generating part connected to a first operation voltage terminal, comparing the voltage stabilized by the voltage stabilization circuit part with an internal reference voltage, and generating a first square wave signal having a duty ratio according to comparison results between the stabilized voltage and the internal reference voltage.

According to another aspect of the present invention, there is provided an AC detection circuit for power supply, the AC detection circuit including: a rectifying part rectifying an AC voltage; a voltage division part dividing the voltage rectified by the rectifying part according to a preset division ratio; a voltage stabilization circuit part stabilizing the voltage divided by the voltage division part; a first square wave generating part connected to a first operation voltage terminal, comparing the voltage stabilized by the voltage stabilization circuit part with an internal reference voltage, and generating a first square wave signal having a duty ratio according to comparison results between the stabilized voltage and the internal reference voltage; and a second square wave generating part connected to a second operation voltage terminal, interlocked with the first square wave generating part, and generating a second square wave signal.

The second square wave generating part may be configured as a photocoupler connected to each of the first and second operation voltage terminals and generating the second square wave signal. The photocoupler may include a photodiode having an anode connected to the first operation voltage terminal and a cathode connected to a first output port; and a phototransistor having a collector connected to the second operation voltage terminal, a base receiving light from the photodiode, and an emitter connected to a second output port, generating the second square wave signal by receiving the light from the photodiode, and outputting the second square wave signal through the second output port.

The rectifying part may be a half-wave rectifying part half-wave rectifying the AC voltage.

The voltage division part may include a plurality of resistors connected in series between an output port of the rectifying part and a ground.

The voltage stabilization circuit part may include a first capacitor connected between a first division node preset in the voltage division part and the ground.

The first square wave generating part may include a shunt regulator having a cathode connected to the first output port, an input port connected to an output port of the voltage stabilization circuit part, and an anode connected to the ground.

The AC detection circuit may further include a protection circuit part having a capacitor connected between a first connection node connected to the first output port and the first division node.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may, however, be embodied in many different forms and should not be construed as being limited to the exemplary embodiments set forth herein. The exemplary embodiments are provided to assist in a comprehensive understanding of the invention.

Figure 1:
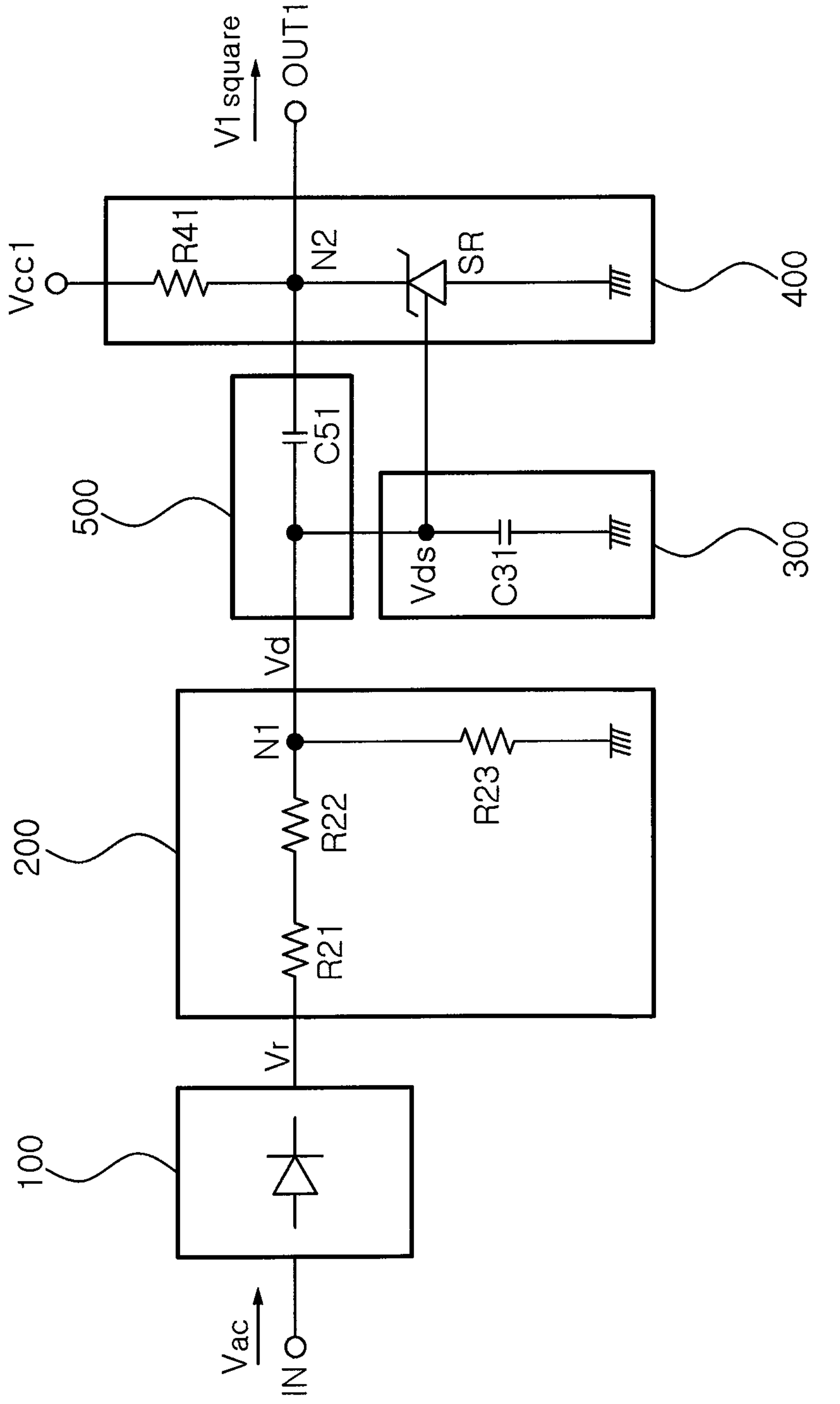
FIG. 1 is a block diagram illustrating an alternating current (AC) detection circuit for power supply according to an exemplary embodiment of the present invention.

FIG. 1 is a block diagram illustrating an alternating current (AC) detection circuit for power supply according to an exemplary embodiment of the present invention.

Referring to FIG. 1, an AC detection circuit for power supply according to this embodiment includes a rectifying part 100 rectifying an AC voltage Vac inputted from an input port IN; a voltage division part 200 dividing the voltage Vr rectified by the rectifying part 100 according to a preset division ratio; a voltage stabilization circuit part 300 stabilizing the voltage Vd divided by the voltage division part 200; and a first square wave generating part 400 connected to a first operation voltage Vcc1 terminal, comparing the voltage Vds stabilized by the voltage stabilization circuit part 300 with an internal reference voltage Vref, and generating a first square wave signal V1square having a duty ratio according to comparison results between the voltage Vds and the internal reference voltage Vref.

Figure 2:
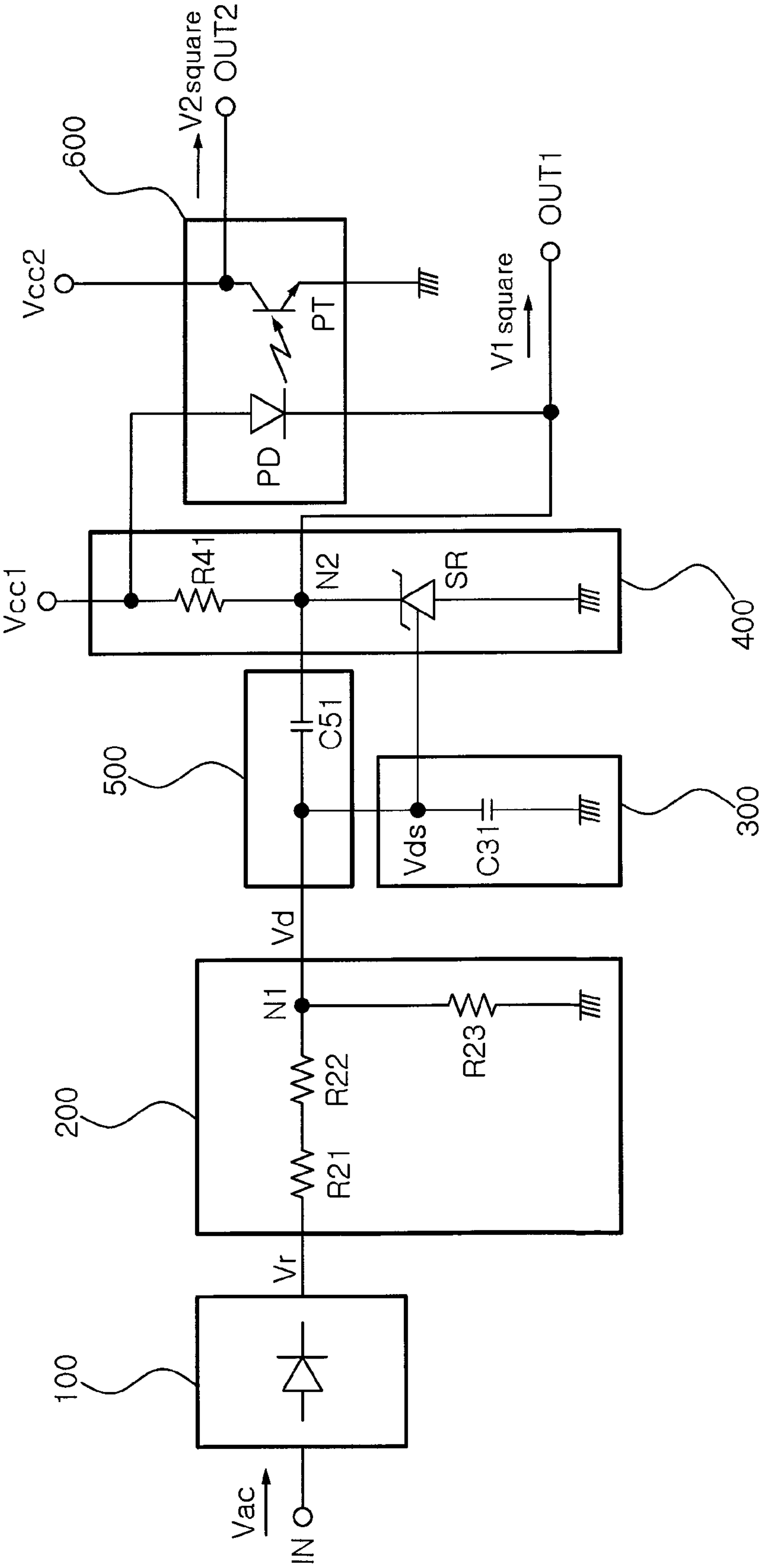
FIG. 2 is a signal timing chart of an AC detection circuit for power supply according to an exemplary embodiment of the present invention.

FIG. 2 is a signal timing chart of an AC detection circuit for power supply according to an exemplary embodiment of the present invention. In FIG. 2, Vac is an AC voltage inputted into the rectifying part 100; Vr is a rectified voltage outputted from the rectifying part 100; Vds is an input voltage of the first square wave generating part 400, which is stabilized by the voltage stabilization circuit part 300; and V1square is a first square wave signal outputted from the first square wave generating part 400.

Figure 3:
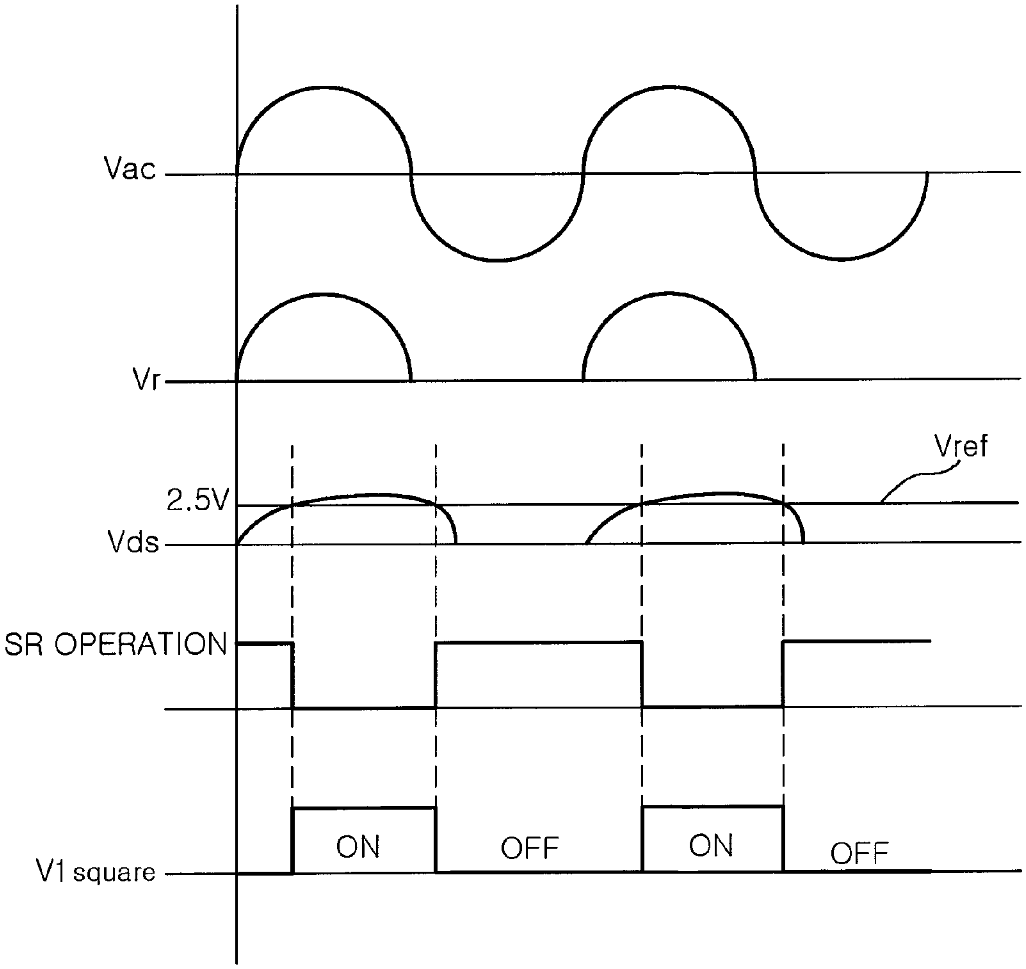
FIG. 3 illustrates another configuration for an AC detection circuit for power supply according to an exemplary embodiment of the present invention.

FIG. 3 illustrates another configuration for an AC detection circuit for power supply according to an exemplary embodiment of the present invention.

Referring to FIG. 3, an AC detection circuit for power supply according to this embodiment includes the rectifying part 100 rectifying an AC voltage Vac inputted from the input port IN; the voltage division part 200 dividing the voltage Vr rectified by the rectifying part 100 according to a preset division ratio; the voltage stabilization circuit part 300 stabilizing the voltage Vd divided by the voltage division part 200; the first square wave generating part 400 connected to a first operation voltage Vcc1 terminal, comparing the voltage Vds stabilized by the voltage stabilization circuit part 300 with an internal reference voltage Vref, and generating a first square wave signal V1square having a duty ratio according to comparison results between the voltage Vds and the internal reference voltage Vref; and a second square wave generating part 600 connected to a second operation voltage Vcc2 terminal, interlocked with the first square wave generating part 400, and generating a second square wave signal V2square.

Also, referring to FIG. 3, the second square wave generating part 600 may be configured as a photocoupler connected to each of the terminals of the first and second operation voltages Vcc1 and Vcc2 and generating the second square wave signal V2square.

Here, the photocoupler may include a photodiode PD having an anode connected to the first operation voltage Vcc1 terminal and a cathode connected to a first output port OUT1, and a phototransistor PT having a collector connected to the second operation voltage Vcc2 terminal, a base receiving light from the photodiode PD, and an emitter connected to a second output port OUT2. The phototransistor PT receives the light from the photodiode PD, generates the second square wave signal V2square, and outputs the second square wave signal V2square through the second output port OUT2.

Referring to FIGS. 1 through 3, the rectifying part 100 may be a half-wave rectifying part, half-wave rectifying the AC voltage Vac.

The voltage division part 200 may include a plurality of resistors connected in series, divide voltage at an intermediate node preset between the plurality of resistors, and output the divided voltage. Here, the number of series-connected resistors or the resistance values thereof may be variable according to the actual states of a power supply.

For example, as shown in FIGS. 1 and 3, the voltage division part 200 may include a plurality of resistors R21 to R23 connected in series between an output port of the rectifying part 100 and a ground.

The voltage stabilization circuit part 300 may include a first capacitor C31 connected between a first division node N1, preset in the voltage division part 200, and the ground, so as to stabilize the voltage by removing AC components such as ripple contained in the voltage or noise components.

The first square wave generating part 400 may include a shunt regulator SR having a cathode connected to the first output port OUT1 outputting the first square wave signal V1square, an input port connected to an output port of the voltage stabilization circuit part 300, and an anode connected to the ground. Here, the cathode is connected to the first operation voltage Vcc1 terminal through a resistor R41.

Meanwhile, as shown in FIGS. 1 and 3, the AC detection circuit for power supply may include a protection circuit part 500 having a capacitor C51 connected between a first connection node N2 connected to the first output port OUT1 and the first division node N1, so as to protect the shunt regulator from surge voltage.

Hereinafter, the operation and effect of the invention will be described in detail with reference to the accompanying drawings.

Referring to FIG. 1, the AC detection circuit for power supply according to this embodiment may include the rectifying part 100, the voltage division part 200, the voltage stabilization circuit part 300, and the first square wave generating part 400.

Here, the rectifying part 100 halfwave rectifies an AC voltage Vac of 90V or more and outputs the rectified voltage to the voltage division part 200. For example, the rectifying part 100 may be configured as a rectifying diode. In this case, the rectifying diode halfwave rectifies the AC voltage and outputs the rectified voltage to the voltage division part 200.

The voltage division part 200 divides the rectified voltage according to a preset division ratio. For example, the voltage division part 200 may include a plurality of resistors having resistance values which are set to divide the AC voltage into a higher voltage than an internal reference voltage of the first square wave generating part 400 in a normal state.

As an example, referring to FIGS. 1 and 3, the voltage division part 200 may include first, second, and third resistors R21 to R23 connected in series between the output port of the rectifying part 100 and the ground. In this case, the voltage Vd, divided at the first division node N1 between the second resistor R22 and the third resistor R23, may be supplied.

The voltage stabilization circuit part 300 stabilizes the voltage Vd divided by the voltage division part 200 so as to improve voltage detection accuracy, and then supplies the stabilized voltage Vds to the first square wave generating part 400. Accordingly, the first square wave generating part 400 may be able to operate more accurately.

For example, the voltage stabilization circuit part 300 may include the first capacitor C31. In this case, the first capacitor C31 allows the voltage between the first division node N1, preset in the voltage division part 200, and the ground, to be smoothed. This smoothing of the first capacitor C31 allows the voltage Vds, inputted from the voltage stabilization circuit part 300 to the first square wave generating part 400, to be stabilized.

Then, the first square wave generating part 400 compares the voltage Vds stabilized by the voltage stabilization circuit part 300 with an internal reference voltage Vref and outputs a square wave signal having a duty ratio according to comparison results between the voltage Vds and the internal reference voltage Vref.

That is, as shown in FIG. 2, as a result of comparing the voltage Vds with the internal reference voltage Vref, when the voltage Vds is higher than the internal reference voltage Vref, a low-level first square wave signal is outputted. In contrast, when the voltage Vds is not higher than the internal reference voltage Vref, a high-level first square wave signal is outputted.

The configurations for the first square wave generating part 400 will be described in detail with reference to FIGS. 1 and 3.

The first square wave generating part 400 may be configured as a shunt regulator SR having a cathode connected to the first output port OUT1, an input port connected to the output port of the voltage stabilization circuit part 300, and an anode connected to the ground. Here, the shunt regulator SR turns on when an input voltage Vds inputted through the input port is higher than an internal reference voltage Vref, otherwise it turns off.

Specifically, when the shunt regulator SR turns on, a low-level square wave signal is outputted. On the other hand, when the shunt regulator SR turns off, a high-level square wave signal is outputted.

That is, when the shunt regulator SR turns on, a low-level first square wave signal V1square is outputted through the first output port OUT1. On the other hand, when the shunt regulator SR turns off, a high-level first square wave signal V1square is outputted through the first output port OUT1.

Meanwhile, in the case that the AC detection circuit for power supply further includes the second square wave generating part 600, the second square wave generating part 600 is connected to terminals of first and second operation voltages Vcc1 and Vcc2 and interlocked with the first square wave generating part 400, thereby generating a second square wave signal V2square.

More particularly, referring to FIG. 3, the second square wave generating part 600 may be configured as a photocoupler connected to each of the terminals of the first and second operation voltages Vcc1 and Vcc2 and generating the second square wave signal V2square.

In this case, referring to FIG. 3, the photodiode PD of the photocoupler turns on when the shunt regulator SR turns on. The current is coupled to the phototransistor PT through the photodiode PD of the photocoupler, so the phototransistor PT operates such that the second operation voltage Vcc2 is connected to the ground. Accordingly, a low-level second square wave signal V2square is outputted.

In contrast, the photodiode PD of the photocoupler turns off when the shunt regulator SR turns off. The current fails to be coupled to the phototransistor PT through the photodiode PD of the photocoupler, so the phototransistor PT does not operate. Accordingly, the second operation voltage Vcc2 is outputted as a high-level second square wave signal V2square through the second output port OUT2.

As described above, as compared to a conventional circuit using a Zener diode, this invention provides the advantages of a great reduction in both the number of required components and manufacturing costs. Also, an AC voltage, applicable to a power supply such as that of a plasma display panel (PDP), is detected, and a square wave signal can be supplied to the secondary side of a power transformer as well as to the primary side thereof.

As set forth above, according to exemplary embodiments of the invention, the AC detection circuit applicable to a power supply such as that of the PDP is configured to detect an AC input and output a square wave signal using the square wave generating part such as a shunt regulator, whereby the number of required components is greatly reduced and the manufacturing cost is reduced accordingly.

While the present invention has been shown and described in connection with the exemplary embodiments, it will be apparent to those skilled in the art that modifications and variations can be made without departing from the spirit and scope of the invention as defined by the appended claims.

What is claimed is:

1. An alternating current (AC) detection circuit for power supply, the AC detection circuit comprising:

a rectifying part configured to rectify an AC voltage;

a voltage division part configured to divide the rectified voltage according to a preset division ratio;

a voltage stabilization circuit part configured to stabilize the divided voltage;

a first square wave generating part connected to a first operation voltage terminal and configured to compare the stabilized voltage with an internal reference voltage, and generate a first square wave signal having a duty ratio based on a result of comparing the stabilized voltage and the internal reference voltage; and a second square wave generating part connected to a second operation voltage terminal and configured to be interlocked with the first square wave generating part, and generate a second square wave signal, wherein the second square wave generating part is configured as a photocoupler connected to each of the first and second operation voltage terminals and configured to generate the second square wave signal.

2. The AC detection circuit of claim 1, wherein the photocoupler comprises:

a photodiode having an anode connected to the first operation voltage terminal and a cathode connected to a first output port for outputting the first square wave signal; and a phototransistor having a collector connected to the second operation voltage terminal, a base configured to receive light from the photodiode, and an emitter connected to a second output port and configured to generate the second square wave signal based on the light received from the photodiode and output the second square wave signal through the second output port.

3. The AC detection circuit of claim 2, wherein the rectifying part includes a half-wave rectifying part configured to half-wave rectify the AC voltage.

4. The AC detection circuit of claim 3, wherein the voltage division part comprises a plurality of resistors connected in series between an output port of the rectifying part and a ground.

5. The AC detection circuit of claim 4, wherein the voltage stabilization circuit part comprises a first capacitor connected between a first division node preset in the voltage division part and the ground.

6. The AC detection circuit of claim 5, wherein the first square wave generating part comprises a shunt regulator having a cathode connected to the first output port for outputting the first square wave signal, an input port connected to an output port of the voltage stabilization circuit part, and an anode connected to the ground.

7. The AC detection circuit of claim 6, further comprising a protection circuit part having a capacitor connected between a first connection node connected to the first output port and the first division node.

* * * * *